(12) United States Patent
Erpelding et al.

(10) Patent No.: US 6,351,348 B1
(45) Date of Patent: Feb. 26, 2002

(54) MINIMAL STIFFNESS CONDUCTORS FOR A HEAD GIMBAL ASSEMBLY

(75) Inventors: A. David Erpelding; Darrell D. Palmer; Oscar J. Ruiz; Surya Pattanaik, all of San Jose, CA (US)

(73) Assignee: International Business Machines Corporation, Armonk, NY (US)

( * ) Notice: Subject to any disclaimer, the term of this patent is extended or adjusted under 35 U.S.C. 154(b) by 1403 days.

(21) Appl. No.: 08/685,420

(22) Filed: Jul. 22, 1996

Related U.S. Application Data (63) Continuation of application No. 08/353,173, filed on Dec. 8, 1994, now abandoned, which is a continuation-in-part of application No. 08/270,928, filed on Jul. 5, 1994, now abandoned, which is a continuation-in-part of application No. 08/213,913, filed on Mar. 15, 1994, now abandoned.

(51) Int. Cl.$^7$ .................................................. G11B 5/48
(52) U.S. Cl. .................................. 360/244.3; 360/245.4
(58) Field of Search ................................. 360/103, 104, 360/105, 245.4, 244.3, 245, 245.3, 245.5, 245.9

(56) References Cited

U.S. PATENT DOCUMENTS

| | | | |
|---|---|---|---|
| 4,167,765 A | 9/1979 | Watrous | 360/103 |
| 4,543,295 A | 9/1985 | St. Clair et al. | 428/458 |
| 4,594,221 A | 6/1986 | Caron et al. | 420/485 |
| 4,639,289 A | 1/1987 | Lazzari | 156/643 |
| 4,732,733 A | 3/1988 | Sakamoto et al. | 420/485 |
| 4,761,699 A | 8/1988 | Ainslie et al. | 360/103 |

(List continued on next page.)

FOREIGN PATENT DOCUMENTS

| | | | |
|---|---|---|---|
| EP | 0568257 A1 | 11/1993 | |
| EP | 0 599 669 A2 | 6/1994 | |
| GB | 2193833 | 2/1988 | |
| JP | 5319015 | * 2/1978 | 360/103 |
| JP | 53-30310 | 3/1978 | |
| JP | 60-246015 | 12/1985 | |
| JP | 60246015 | * 12/1985 | 360/103 |
| JP | 01-248372 | 3/1989 | |
| JP | 03-91173 | 4/1991 | |
| JP | 4219618 | * 8/1992 | 360/103 |
| JP | 5282642 | * 10/1993 | 360/103 |
| WO | WO 92/143345 | 8/1992 | |
| WO | WO 94/16438 | 7/1994 | |

OTHER PUBLICATIONS

08/122,879 Sep. 16, 1993 Frater et al.
08/270,928 Jul. 5, 1994 Erpelding et al.
08/213,913 Mar. 15, 1994 Erpelding et al.
Anonymous disclosure, "Circuitized Suspension Flexure–"Foliage" for Disk Drives," Published in Research Disclosure, No. 339, Kenneth Mason Publications Ltd, England (Jul. 1992).

(List continued on next page.)

*Primary Examiner*—William Klimowicz
(74) *Attorney, Agent, or Firm*—Donald J. Pagel

(57) ABSTRACT

A suspension system for supporting a magnetic read/write slider comprising a load beam, a slider support member and a flexure comprised of a first flexure arm and a second flexure arm. A plurality of electrical conductors extend along the edge of the load beam on the side of the load beam farthest away from the disk hub. The electrical conductors are positioned adjacent to, but outside of, the second flexure arm, so as not to contribute to the stiffness of the second flexure arm. The electrical conductors are comprised of a laminated material which includes a conductor layer, such as a high strength copper alloy, a dielectric layer and a support layer. In another embodiment, the flexure includes a first flexible finger recion and a second flexible finger region. A first plurality of slots extend completely through the first flexible finger region, and a second plurality of slots extend completely through the second flexible finger region for providing regions into which the electrical conductors can move when the flexure undergoes deflections.

16 Claims, 8 Drawing Sheets

U.S. PATENT DOCUMENTS

| | | | |
|---|---|---|---|
| 4,789,914 A | 12/1988 | Ainslie et al. | 360/103 |
| 4,792,875 A | 12/1988 | Ohdaira | 360/104 |
| 4,819,094 A | 4/1989 | Oberg | 360/104 |
| 4,839,232 A | 6/1989 | Morita et al. | 428/473.5 |
| 4,906,803 A | 3/1990 | Albrechta et al. | 439/77 X |
| 4,937,133 A | 6/1990 | Watanabe et al. | 428/209 |
| 4,991,045 A | 2/1991 | Oberg | 360/104 |
| 4,996,623 A | 2/1991 | Erpelding et al. | 360/104 |
| 5,145,553 A | 9/1992 | Albrechta et al. | 156/640 |
| 5,198,945 A | 3/1993 | Blaeser et al. | 360/104 |
| 5,298,331 A | 3/1994 | Kanakarajan et al. | 428/458 |
| 5,334,346 A | 8/1994 | Kim et al. | 420/4.85 |
| 5,353,181 A | 10/1994 | Frater et al. | 360/104 |
| 5,424,030 A | 6/1995 | Takahashi | 420/473 |
| 5,427,848 A | 6/1995 | Baer et al. | 428/332 |

OTHER PUBLICATIONS

Cooper et al., "Constrained Layer Damper Spring Assemblies," IBM Technical Disclosure Bulletin, vol. 33, No. 8, pp. 373–374 (Jan. 1991).

Ohwe et al., "Development of Integrated Suspension System for a Nanoslider with an MR Head Transducer," two-page preprint (not dated).

Rogers Corporation, "FLEX–I–MED® Adhesiveless Laminate," Product Data Sheet (not dated).

Mitsui Toatsu Chemicals, Inc. "Kool Base®," Product Data Sheet, pp. 1–7 (not dated).

DuPont, "Kapton® EKJ Self–Adhering Polyimide Composite Films," Product Data Sheet (not dated).

* cited by examiner

MINIMAL STIFFNESS CONDUCTORS FOR A HEAD GIMBAL ASSEMBLY

This application is a continuation of Ser. No. 08/353,173 filed Dec. 8, 1994, now abandoned, which is a continuation-in-part of Ser. No. 08/270,928, filed on Jul. 5, 1994, now abandoned which is a continuation-in-part of Ser. No. 08/213,913, filed on Mar. 15, 1994, now abandoned.

TECHNICAL FIELD

The present invention relates to a head gimbal assembly for a data recording disk file and more particularly to a head gimbal assembly in which the electrical conductors make a minimal contribution to the stiffness of the flexure.

BACKGROUND ART

Magnetic recording disk files that utilize a transducer mounted on a slider for reading and/or writing data on at least one rotatable disk are well-known in the art. In such systems, the slider is typically attached to an actuator arm by a suspension system.

The use of solder balls for attaching the slider to a slider support means is known in the art. For example, Ainslie et al., in U.S. Pat. No. 4,761,699, disclose the use of reflowed solder balls for making both the mechanical attachment of the slider to the suspension and the electrical connection of the transducer to the disk file read/write electronics.

The use of laminated materials for constructing slider suspension systems is also known in the art. For example, Erpelding et al., in U.S. Pat. No. 4,996,623, disclose a suspension system comprised of a sheet of polyimide material sandwiched between two metal layers. This patent also discloses that a plurality of conductors can be formed in the copper layer of the suspension for providing electrical connections to the slider. Additionally, the use of discrete layers for constructing the suspension is also known. For example, G. Oberg, in U.S. Pat. No. 4,819,094, discloses a suspension system in which flexible copper conductors are sandwiched between a pair of polyimide films.

Many suspension systems (also called head gimbal assemblies) include a flexure that is positioned in some manner between the slider and the suspension. For example, R. Watrous, in U.S. Pat. No. 4,167,765, discloses a flexure that is added onto a stiffened member. Blaeser et. al, in U.S. Pat. No. 5,198,945, disclose another design that utilizes the material of the suspension as the flexure.

A problem with both of these approaches is that it is difficult to make electrical connections between the magnetic transducer and signal conductors on the suspension without adversely affecting the pitch and roll stiffness of the head gimbal assembly.

An approach to reducing the influence of the electrical lead wires on the spring characteristics of the suspension is illustrated by M. Takahashi, in Japanese Kokai No. 53-30310. This document discloses a magnetic head assembly in which the electrical lead wires are imbedded in a flexible print plate which functions as a spring. Toshima et al., in Japanese Kokai No. 60-246015, disclose a similar system.

SUMMARY OF THE PRESENT INVENTION

Briefly, the preferred embodiment of the present invention is a suspension system for supporting a magnetic read/write slider comprising a load beam for mechanically supporting a slider, a slider support member for providing a region on which the slider is mechanically attached, and a flexure for connecting the load beam to the slider support member. The flexure comprises a first flexure arm which forms a first outside edge of the flexure, and a second flexure arm which forms a second outside edge of the flexure. The first flexure arm is positioned closer to the disk hub than the second flexure arm.

A plurality of electrical conductors for electrically connecting a magnetic data transducer formed on the slider to the disk file electronic system, extend along the edge of the load beam on the side of the load beam that contains the second flexure arm. The electrical conductors are positioned adjacent to the second flexure arm, but are outside of the second flexure arm so as not to contribute to the stiffness of the second flexure arm.

In the preferred embodiment, the electrical conductors are comprised of a laminated material which includes a conductor layer, a dielectric layer and a support layer. The conductor layer is comprised of a high strength electrically conductive material such as a high strength copper alloy. The dielectric layer is comprised of an electrically insulating material such as a polyimide, Teflon or epoxy. The support layer is comprised of a nonmagnetic, high strength material such as stainless steel, titanium or beryllium copper.

In the region adjacent to the second flexure arm, the support layer is completely removed from underneath the conductors. In the region along the edge of the load beam, the support layer is removed from underneath the conductors which function as read lines. The use of high strength materials in the conductive layer allows the support layer to be removed in the regions described above, without making the conductors excessively fragile.

An alternative embodiment of the present invention comprises a suspension system having a flexure for connecting the load beam to the slider support member. The flexure includes a first flexible finger region which extends along a first outside edge of the flexure and a second flexible finger region which extends along a second outside edge of the flexure. A first plurality of slots extend completely through the first flexible finger region, and a second plurality of slots extend completely through the second flexible finger region.

A first plurality of electrical conductors extend along the first flexible finger region, and are positioned over the first plurality of slots. A second plurality of electrical conductors extend along the second flexible finger region and are positioned over the second plurality of slots. The slots provide region into which the electrical conductors can move when the flexure undergoes deflections, thereby reducing the contribution to the flexure stiffness made by the conductors.

The flexure is comprised of a laminated material which includes a conductor layer, a dielectric layer and a support layer. The conductor layer is comprised of a high strength electrically conductive material, such as a high strength copper alloy, thereby allowing the electrical conductors to be formed directly in this layer. The dielectric layer is comprised of an electrically insulating material such as a polyimide, Teflon or epoxy. The support layer is comprised of a nonmagnetic, high strength material such as stainless steel, titanium or beryllium copper.

DETAILED DESCRIPTION OF THE PREFERRED EMBODIMENT

Figure 1:
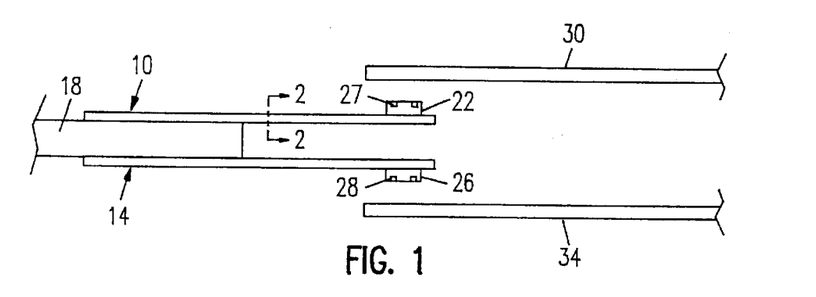
FIG. 1 is a schematic side view of a slider suspension system according to the present invention.

FIG. 1 is a schematic diagram of a first transducer suspension 10 and a second transducer suspension 14 attached to an actuator arm 18. The suspensions 10 and 14 are also referred to as head gimbal assemblies.

A first slider 22 is positioned at an end of the first transducer suspension 10 distally to the arm 18. A second slider 26 is positioned at an end of the second transducer suspension 14 distally to the arm 18. The slider 22 includes one or more data transducers 27 for reading and/or writing data on a magnetic medium such as a hard magnetic disk 30. Similarly, the slider 26 includes one or more data transducers 28 for reading and/or writing data on a magnetic medium such as a hard magnetic disk 34.

Figure 2:
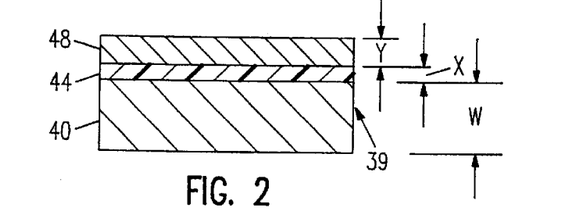
FIG. 2 is a cross-sectional view of the slider suspension system taken along the line 2—2 of FIG. 1.

FIG. 2 is a cross-sectional view of the first transducer suspension 10 illustrating that the suspension 10 is a multilayered laminate 39 comprised of a first layer 40, a second layer 44 and a third layer 48. The first layer 40 is positioned adjacent to one surface of the second layer 44. The third layer 48 is positioned adjacent to a different surface of the second layer 44 so that the second layer 44 separates the first layer 40 and the third layer 48, with the layers 40, 44 and 48 all lying in planes that are parallel to each other. The layers 40, 44 and 48 are generally secured together by a thin adhesive layer applied between layers 40 and 44 and between layers 44 and 48.

Representative dimensions and compositions for the various elements illustrated in FIG. 2 are as follows: In the preferred embodiment, the first layer 40 has a thickness "w" of approximately 0.051 millimeters and comprises full hard 301, 302 or 304 stainless steel. In more general terms, the first layer 40 has a thickness "w" of approximately 0.076 millimeters, or less, and comprises a rigid material such as stainless steel. Typically, the first layer 40 comprises 300 series stainless steel, but other stainless steels and other rigid materials could also be used (e.g. beryllium copper or titanium).

In the preferred embodiment, the second layer 44 comprises a polyimide that has properties similar to the properties of Kapton® E brand polyimide manufactured by E. I. Du Pont de Nemours and Company ("Dupont"), including a dielectric constant in the range of approximately 3.0 to 3.5. Additionally, the coefficient of thermal expansion (CTE) of the polyimide should be such that the laminate 39 will be in a neutral stress condition after the laminate 39 is manufactured. A neutral stress condition means that the laminate 39 will remain flat after manufacturing and will not curl up after either the first layer 40 or the third layer 48 are etched. Furthermore, the adhesive used to secure the layers 40, 44 and 48 together should be sufficiently robust to keep the laminate 39 intact up to a temperature of approximately 350° C.

In the preferred embodiment, the second layer 44 has a thickness "x" of approximately 0.0165 millimeters. This thickness is chosen because a thin layer 44 is needed to keep the stiffness of the suspension 10 low, but the price of polyimide films thinner than 0.0165 millimeters is a limiting consideration.

Rogers Corporation (Circuit Materials Unit), of Chandler, Ariz., supplies a laminate 39 having a second layer 44 that meets the specifications listed above. In ordering the laminate 39, the desired material for the third layer 48, such as one of the alloys described below, is provided to Rogers Corporation along with the specifications for the first layer 40, the second layer 44 and the third layer 48. Rogers Corporation then prepares a suitable laminate using proprietary methods.

In the Rogers laminate, the second layer 44 comprises a 0.0165 millimeter polyimide layer (layer 44) which is thought to be the same polyimide (or a similar polyimide) as is used in the Kool Base® brand material manufactured by Mitsui Toatsu Chemicals, Inc. In the Kool Base polyimide, a thin layer of adhesive is applied to each side of the polyimide layer for bonding the layer 44 to the layers 40 and 48.

A substitute for the Rogers laminate is a laminate custom manufactured by Dupont having a 0.0165 millimeter layer of Dupont's EKJ self-adhering polyimide composite (Kapton® E brand polyimide manufactured by Dupont) and meeting the other specifications listed above for the second layer 44.

Stated more generally, the second layer 44 has a thickness "x" of approximately 0.018 millimeters or less, and comprises a dielectric material such as a polyimide having a dielectric constant in the range of approximately 3.0 to 3.5 and a coefficient of thermal expansion (CTE) which allows the laminate 39 to be in a neutral stress condition after the laminate 39 is manufactured.

Polyimides of the types described in U.S. Pat. Nos. 4,839,232, 4,543,295 and 5,298,331 are potentially useful as the second layer 44, although the suitability of a specific polyimide for a particular purpose should be verified. Additionally, Teflon compounds of the formula $F(CF_2)_nF$ are also suitable for use in the second layer 44, as are nonconductive epoxies and other dielectric materials.

In the preferred embodiment, the third layer 48 has a thickness "y" of approximately 0.0178 millimeters and comprises a copper-nickel-silicon-magnesium alloy such as the copper alloy C7025 with a TMO3 temper (full hard heat temper) manufactured by Olin Brass (composition 96.2% Cu; 3% Ni; 0.65% Si; and 0.15% Mg).

Examples of other specific materials that can function as the third layer 48 include the following: 1. a high strength beryllium copper alloy (composition: 97.2–98.4% Cu; 0.2–0.6% Be; and 1.4–2.2% Ni, such as Brush Wellman beryllium copper alloy 3 (C17510) with an HT temper); 2. a high strength brass alloy (composition: 97.5% Cu; 2.35% Fe; 0.03% P; and 0.12% Zn, such as Olin Brass copper alloy C194 with an ex. spring temper); 3. a high strength titanium copper alloy (composition: 96.1–96.6% Cu; and 2.9–3.4% Ti, such as Nippon Mining titanium copper alloy with a TiCuR1-EHM temper).

Stated more generally, the third layer 48 comprises a high strength electrically conducting material and has a thickness "y" of approximately 0.018 millimeters or less. For purposes of the present invention, the term "high strength" refers to a material with a tensile yield strength ($S_y$) greater than 70 ksi (kilopounds per square inch) and which doesn't soften by more than 10% when exposed to a temperature of 300° C. for one hour.

Figure 3:
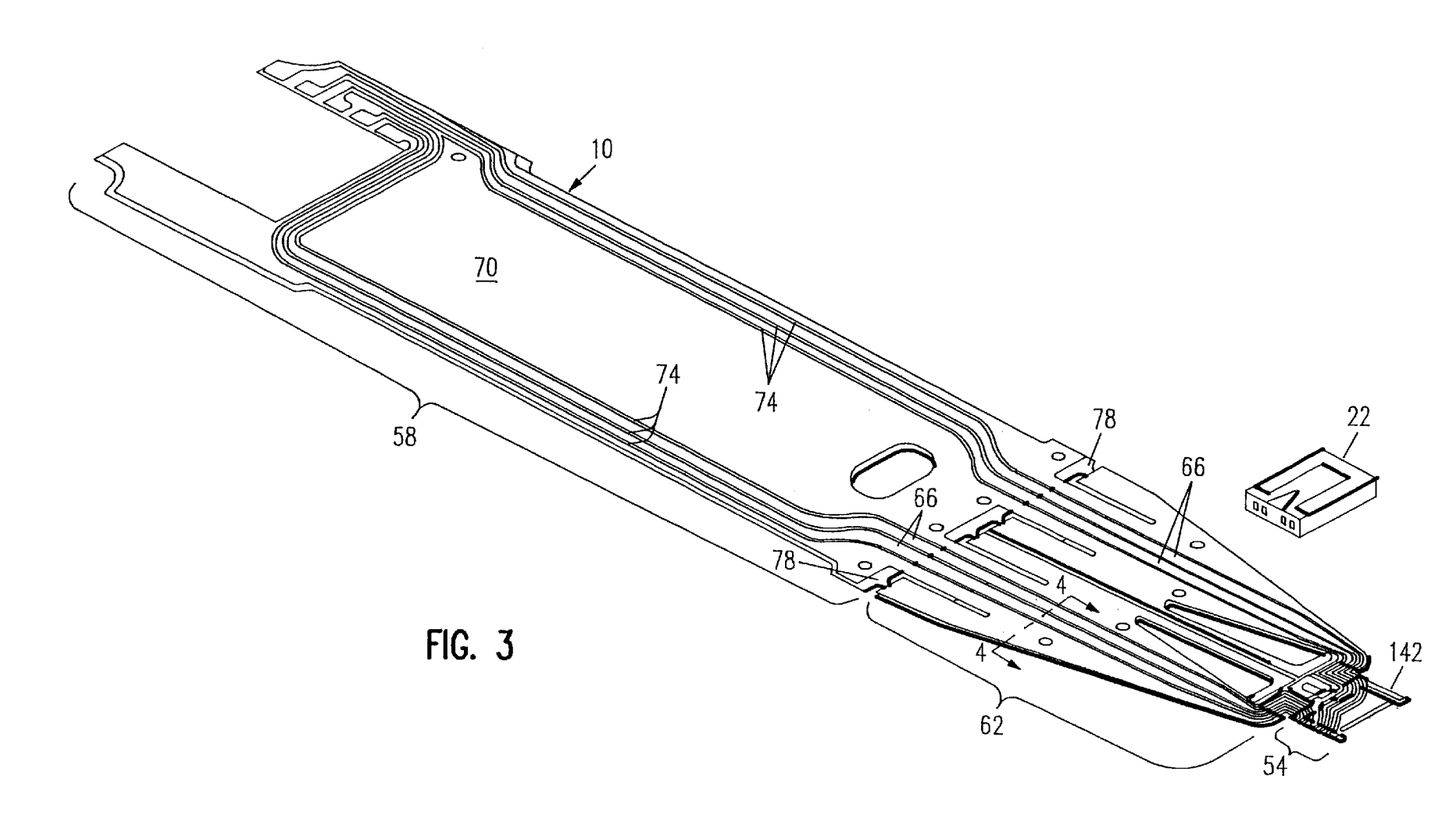
FIG. 3 is an isometric view of a slider suspension system.

FIG. 3 is an isometric view of the first transducer suspension 10. The suspension 10 has a slider portion 54, an arm portion 58 and a link portion 62 (also referred to as a load beam). A plurality of electrical lines 66 are present on a surface 70 of the system 10. Each electrical line 66 has a space 74 positioned along each of its sides so as to prevent the electrical line 66 from shorting out with an adjacent electrical line 66.

A plurality of hinges 78 are also shown in the surface 70. The hinges 78 are regions in which the third layer 48 has been removed to form channels in the third layer 48. The hinges 78 increase the flexibility of the suspension 10 and/or permit the suspension 10 to be bent at some predetermined angle. Similarly, hinges can also be formed by etching channels in the first layer 40.

Figure 4:
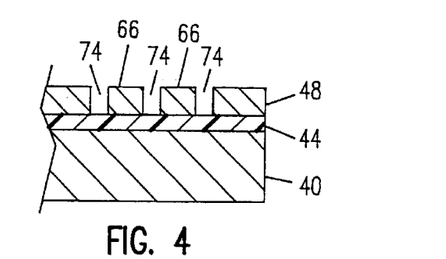
FIG. 4 is a cross-sectional view of the slider suspension system taken along the line 4—4 of FIG. 3.

The portions 54, 58 and 62 designate regions of the suspension 10, but the suspension 10 is preferably formed from one continuous piece of laminated material as is explained herein with respect to FIGS. 2 and 4.

The slider portion 54 is the part of the suspension 10 on which the read/write slider 22 is mounted. The electrical lines 66 form the electrical connections for connecting the slider 22 and the transducer 27 to an external system as is explained later with respect to FIG. 5.

The arm portion 58 is the part of the suspension 10 that is connected to the actuator arm 18. Typically, the arm portion 58 is attached to the actuator arm 18 by bonding, welding, swaging or screwing the arm portion 18 to the actuator arm along the first layer 40 shown in FIG. 2.

The link portion 62 connects the arm portion 58 to the slider portion 54. The suspension 14 is identical to the suspension lo and includes all of the elements shown in FIG. 3, including the portions 54, 58 and 62 and the electrical lines 66.

FIG. 4 is a cross-sectional view of the suspension 10 illustrating that the electrical lines 66 are regions of the third layer 48 that are roughly rectangular in cross section, and that are separated from each adjacent electrical line 66 by one of the spaces 74. The spaces 74 extend down to the second layer 44 so that the second layer 44 is exposed through the space 74.

The electrical lines 66 are formed by etching the surface 70 using standard metal etching techniques. For example, when the third layer 48 comprises one of the copper alloys described above, the layer 48 is etched with ferric chloride or other suitable etchants. The etching process removes metal from specified regions, thereby forming the spaces 74 that define the electrical lines 66. In practice, a typical chemical etching process will not form a groove having the perfect rectangular shape illustrated in FIG. 4 for the spaces 74. Actual grooves formed by a chemical etching process are slightly rounded or tapered as is well-known in the art. In general, features such as the electrical lines 66, the spaces 74 and the hinges 78 are formed directly on the third layer 48 using photolithographic processes or by using numerically controlled imaging such as laser machining.

In the preferred embodiment, the first, second and third layers 40, 44 and 48 initially comprise a continuous sheet of laminated material of copper alloy/polyimide/stainless steel laminate. A plurality of slider suspension systems 10 are then manufactured from the sheet of laminate using the techniques described above.

A general procedure for the preparation of the metal-polyimide laminated material is described by St. Clair et al. in U.S. Pat. No. 4,543,295 (issued Sep. 24, 1985).

Figure 5:
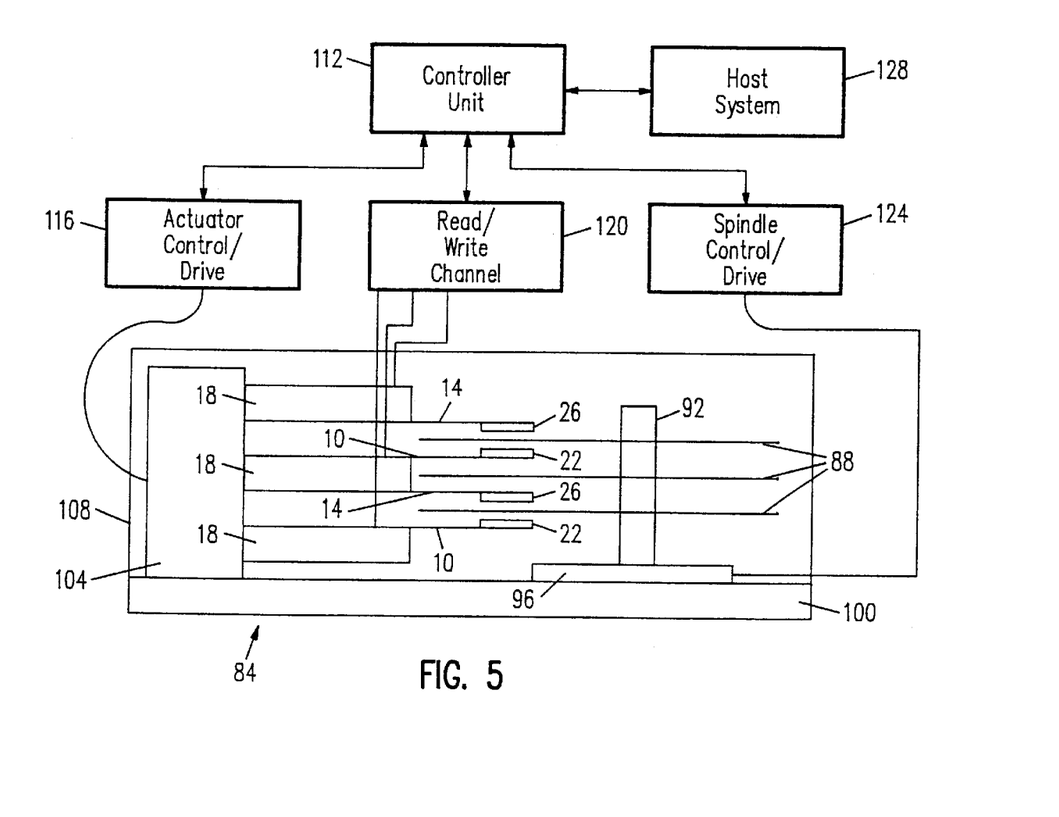
FIG. 5 is a schematic diagram of a disk file that utilizes the slider suspension system according to the present invention.

FIG. 5 is a schematic diagram of a magnetic recording disk file 84 that utilizes the transducer suspension system 10 of the present invention. It should be appreciated that the suspension system 14 is identical to the suspension system 10 so that the following comments apply equally to either the suspension system 10 or the suspension system 14. It should also be appreciated that the suspension systems 10 and 14 could be used with other data storage systems, such as floppy disk drives, optical drives or compact disk players.

The disk file 84 comprises a plurality of magnetic recording disks 88 suitable for use in hard disk drives. The disks 88 are mounted on a spindle shaft 92 which is connected to a spindle motor 96. Motor 96 is mounted to a chassis 100.

The plurality of read/write sliders 22 and 26 are positioned over the disks 88 such that each disk 88 can be accessed by one of the sliders 22 or 26. Each of the sliders 22 and 26 includes a transducer for reading and writing data on a plurality of concentric data tracks on the disks 88 and are attached to one of the suspension systems 10 (or 14). Each of the suspension systems 10 (or 14) are attached to the actuator arm 18 which is attached to a rotary actuator 104. The rotary actuator 104 moves the actuator arm 18 (and hence the suspension system 10 or 14 and the sliders 22 or 26) in a radial direction across the disk 88. An enclosure 108 (shown by a dashed line in FIG. 5) seals the disk file 84 and provides protection from particulate contamination.

A controller unit 112 provides overall control to the system 84. The controller unit 112 contains a central processing unit (CPU), memory unit and other digital circuitry and is connected to an actuator control/drive unit 116 which in turn is electrically connected to the actuator 104. This allows the controller 112 to control the movement of the sliders 22 and 26 over the disks 88. The controller 112 is electrically connected to a read/write channel 120 which in turn is electrically connected to the sliders 22 and 26. This allows the controller 112 to send and receive data from the disks 88. The controller 112 is electrically connected to a spindle control/drive unit 124 which in turn is electrically connected to the spindle motor 96. This allows the controller 112 to control the rotation of the disks 88. A host system 128, which is typically a computer system, is electrically connected to the controller unit 112. The host system 128 may send digital data to the controller 112 to be stored on the disks 88, or may request that digital data be read from the disks 88 and sent to the system 128. The basic operation and structure of data storage systems, such as the disk file 84 (without the suspension systems 10 or 14), is well-known in the art and is described in more detail in *Magnetic Recording Handbook,* C. Dennis Mee and Eric D. Daniel, McGraw-Hill Book Company (1990).

Figure 6:
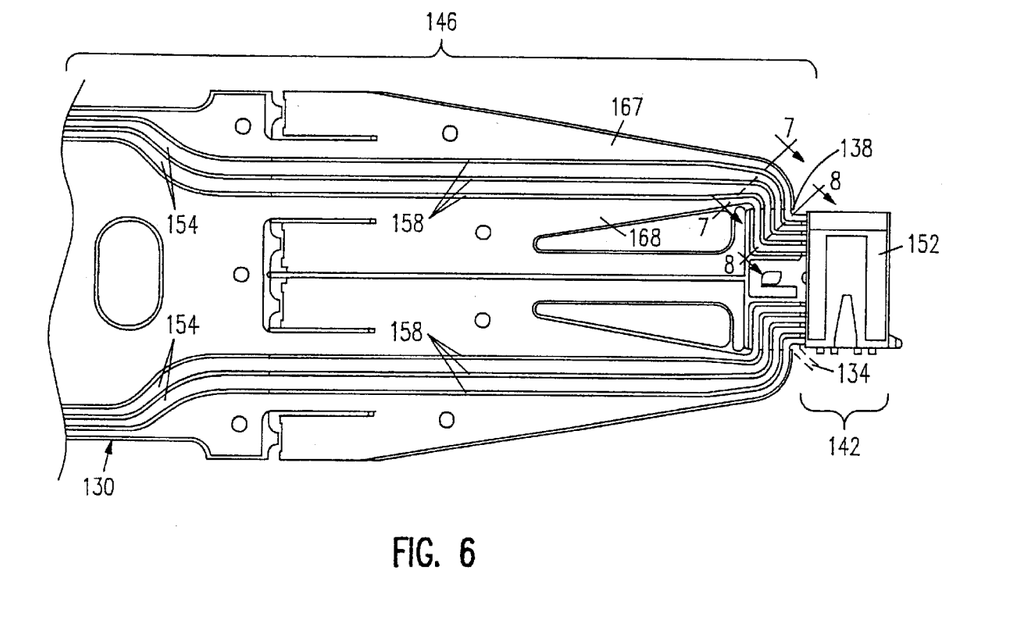
FIG. 6 is a top view of a slider suspension system having a pair of flexures in the head support area.

FIG. 6 is a top view of a transducer suspension 130 having a flexure 134 and a flexure 138. The construction and use of the suspension 130 is analogous to the construction and use of the suspension 10 shown in FIG. 3, and the transducer suspension 130 can be substituted for the suspensions 10 or 14 in the disk file 84 shown in FIG. 5.

Specifically, the suspension 130 has a slider portion 142 analogous to the slider portion 54, a link portion 146 (also referred to as a load beam) analogous to the link portion 62 and an arm portion (not shown) analogous to the arm portion 58. The suspension 130 also includes a slider 152 (which includes one or more data transducers for reading and/or writing data on a magnetic medium) analogous to the slider 22, a plurality of electrical lines 154 analogous to the electrical lines 66 and a plurality of spaces 158 analogous to the spaces 74.

The flexures 134 and 138 are regions of reduced stiffness (compared to the link portion 146) that separate the slider portion 142 from the link portion (load beam) 146 and which function to allow the slider 152 to conform to, and fly over, the recording disk 88.

Figure 7:
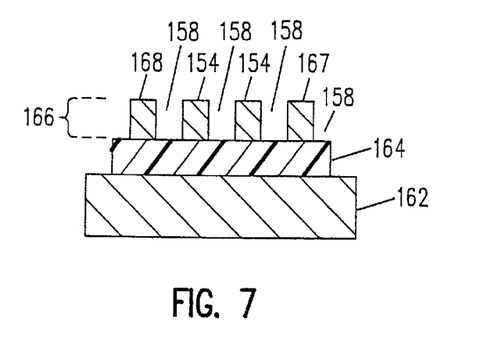
FIG. 7 is a cross-sectional view of the slider suspension system taken along the line 7—7 of FIG. 6.

FIG. 7 is a cross-sectional view of the transducer suspension 130 illustrating that the suspension 130 is a multilayered structure comprised of a first layer 162 analogous to the first layer 40, a second layer 164 analogous to the second layer 44 and a third layer 166 analogous to the third layer 48. The dimensions, compositions and orientations of the layers 162, 164 and 166 are identical to those previously described for the layers 40, 44 and 48 with respect to FIG. 2. In the suspension 130, the layers 162, 164 and 166 are oriented so that the third layer 166 is positioned closest to the disk 88 over which the slider 152 is flying. The laminate 39 shown in FIG. 2 is also oriented this way.

FIG. 7 also illustrates that the electrical lines 154 are regions of the third layer 166 that are roughly rectangular in cross section, and that are separated from each adjacent electrical line 154 by one of the spaces 158. The spaces 158 extend down to the second layer 164 so that the second layer 164 is exposed through the space 158. One of the spaces 158 is positioned along each side of an electrical line 154 so as to prevent the electrical line 154 from shorting out with an adjacent electrical line 154. The electrical lines 154 are formed in the same manner as was previously described for the electrical lines 66. A pair of outer regions 167 and 168 of the third layer 166 function as guard lines to reduce the effect of electromagnetic interference.

Figure 8:
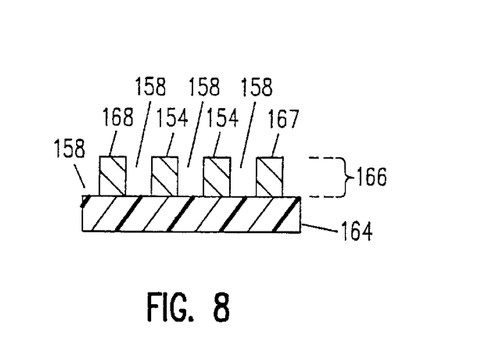
FIG. 8 is a cross-sectional view of the slider suspension system taken along the line 8—8 of FIG. 6.

FIG. 8 is a cross-sectional view illustrating that the flexure 138 comprises a region of the suspension 130 that separates the slider portion 142 from the link portion (load beam) 146 and in which the first layer 162 has been completely removed from underneath the second layer 164 leaving only the layers 164 and 166 to connect the slider portion 142 to the link portion 146. Alternatively, the flexure 138 can comprise a region in which the first layer 162 is only partially removed from underneath the second layer 164. The construction of the flexure 134 is identical to that of the flexure 138.

The total or partial removal of the first layer 162 from underneath the second layer 164 decreases the stiffness of the flexures 134 and 138. The use of a high strength alloy for the third layer 166 gives the flexures 134 and 138 sufficient strength to support the slider portion 142 and the slider 152 (even with the first layer 162 completely or partially removed) while still having the flexibility (low stiffness) required to allow the slider 152 to conform to, and fly over, the recording disk 88.

Referring now to FIGS. 1 and 2, the utility of the laminated structure 39 can be explained. The trend within the hard disk drive industry towards smaller drives has created a demand for very small (and low cost) head gimbal assemblies. The laminated structure of the transducer suspension 10 permits very small head gimbal assemblies to be designed especially when the third layer 48 is comprised of a high strength electrical conductor.

The three layers of the suspension 10 function as follows: The first layer 40 (or 162) is a stiffener layer that gives rigidity to the system 10. The second layer 44 (or 164) is comprised of a dielectric material that functions as an electrical insulator between the first layer 40 (or 162) and the third layer 48 (or 166). For some applications, it is useful if the second layer 44 (or 164) is a dielectric material that also has viscoelastic properties (like a polyimide) which increases damping. Viscoelastic means that the stress in a deformed material is proportional to both the deformation and the rate of deformation. Viscoelastic materials also exhibit creep and relaxation behavior. Creep means that under constant stress the deformation increases in time. Relaxation means that under constant fixed deformation the stress decreases steadily in time.

The third layer 48 (or 166) is comprised of a high strength electrically conducting material, such as one of the high strength copper alloys described previously. The third layer 48 (or 166) is preferably comprised of a high conductivity alloy (e.g. a copper alloy) because the electrical lines 66 (or 154) need to function as efficient electrical conductors.

The use of high strength alloys in the third layer 48 (or 166) is important for several reasons: First, the use of a high strength alloy in the conductor layer reduces the stiffness of the suspension 10 (or 130) which is important when the slider 22 (or 152) is small (See Example 2 below).

Second, the use of a high strength alloy permits the thickness of the third layer 48 (or 166) to be kept less than or equal to eighteen microns (as shown in Example 1 below, thickness varies inversely with the square root of yield strength).

Third, the use of a high strength alloy permits more design options such as the integration of the electrical lines 66 (or 154) and the hinges 78 directly into the third layer 48 (or 166). Similarly, the use of a high strength alloy permits the use of the flexures 134 and 138, because the third layer 166 carries most of the load once the first layer 162 has been removed.

Fourth, the high strength copper alloy adds robustness to the suspension and reduces yield losses due to handling damage during the manufacturing process.

EXAMPLE 1

The use of a high strength alloy reduces the thickness of the third layer 48 (or 166) is illustrated by the following discussion:

The thickness "t" of a rectangular metal strip having a width "w" and a length "L" is related to the yield strength of the material "$S_y$" by equation 1:

$$t = C/\sqrt{S_y} \tag{1}$$

where C=constant=$(6PL/w)^{1/2}$ and P is the load applied to the metal strip to cause it to bend.

The following calculation uses Equation 1 to illustrate that if the metal strip must carry the same load (P) and is comprised of a second material having a yield strength which is three times greater than the yield strength of a first material, then the metal strip comprised of the second material can be 42% thinner and still have the same strength: If $S_{y1}$=soft copper yield strength=30 ksi; and $S_{y2}$=high strength copper alloy yield strength=90 ksi; then $t_2/t_1 = (s_{y1}/s_{y2})^{1/2} = 0.58$ (a 42% reduction in thickness).

EXAMPLE 2

The reason use of a high strength alloy reduces the stiffness of the third layer 48 (or 166) is illustrated by the following discussion:

The stiffness "k" of a rectangular metal strip having a width "w" and length "L" is related to the thickness "t" of the material by equation 2:

$$k = Dt^3 \tag{2}$$

where D=constant=$Ew/6L^3$ and E is Young's modulus.

The following calculation uses Equation 2 and the result of Example 1 to illustrate that if the metal strip must carry the same load (P) and is comprised of a second material having a yield strength which is three times greater than a first material, then the metal strip comprised of the second material has an 81% reduction in stiffness: If $S_{y1}$=soft copper yield strength=30 ksi; and $S_{y2}$=high strength copper alloy yield strength=90 ksi; then $k_2/k_1 = (t_2/t_1)^3 = (0.58)^3 = 0.19$ (an 81% reduction in stiffness).

Figure 9:
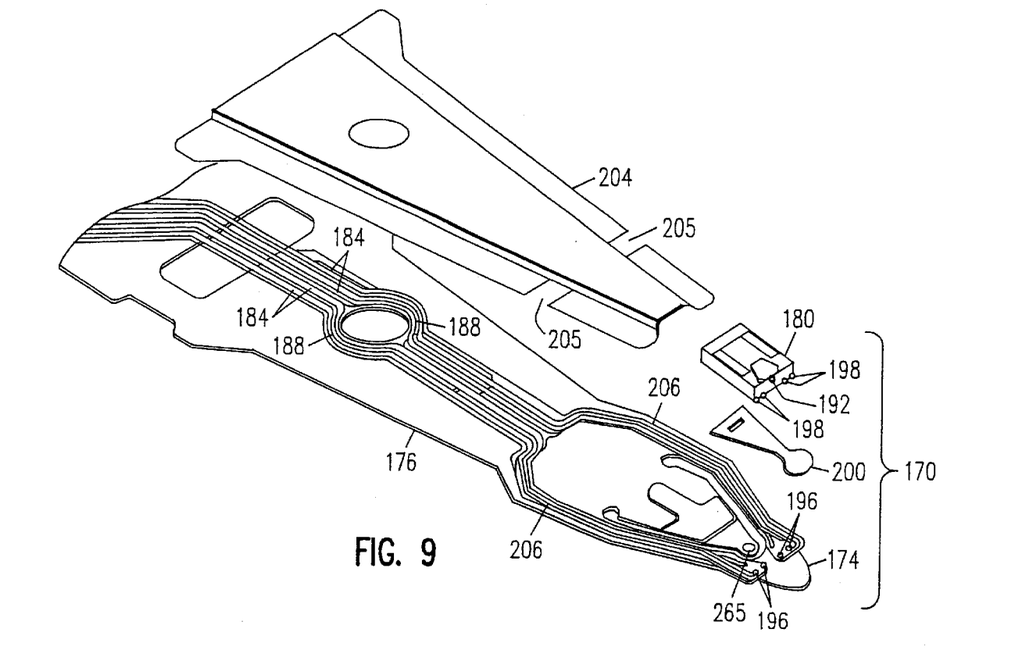
FIG. 9 is an exploded view of a slider suspension system having a pair of flexible finger regions in the flexure according to the present invention.

FIG. 9 is an exploded view of a transducer suspension 170. The construction and use of the suspension 170 is analogous to the construction and use of the suspensions 10 and 130, and the transducer suspension 170 can be substituted for the suspensions 10 or 14 in the disk file 84 shown in FIG. 5.

Specifically, the suspension 170 has a slider portion 174 analogous to the slider portion 54, a link portion 176 (also referred to as a load beam) analogous to the link portion 62 and an arm portion (not shown) analogous to the arm portion 58. The suspension 170 also includes a slider 180 analogous to the slider 22, a plurality of electrical lines 184 analogous to the electrical lines 66 and a plurality of spaces 188 analogous to the spaces 74. The slider 180 also includes one or more data transducers 192 for reading and/or writing data on a magnetic medium.

A plurality of solder balls 196 are positioned at the ends of the electrical lines 184. The solder balls 196 are positioned for fusing to a plurality of solder balls 198 located on the slider 180. When fused together, the solder balls 196 and 198 form the electrical connectors 208 (shown in FIG. 10).

The suspension 170 also includes a shim 200 and a stiffener 204. The stiffener 204 is an optional element that functions to increase the rigidity of the link portion 176. If rigidity of the link portion 176 is not required, or if it is achieved by additional forming of the link portion 176, then the stiffener 204 may be deleted from the suspension 170. A pair of notches 205 prevent the stiffener 204 from shorting the electrical lines 184 in a pair of regions 206.

Figure 10:
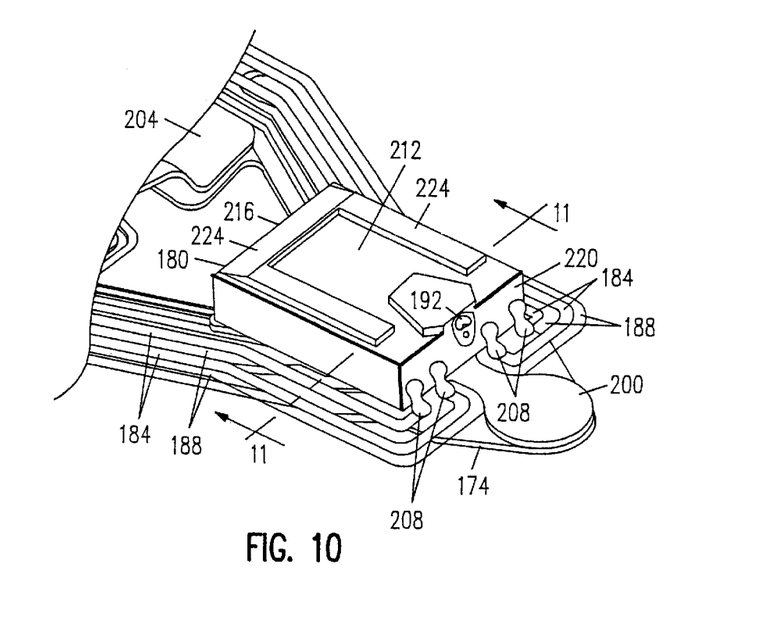
FIG. 10 is an isometric view of a slider showing a plurality of right angle fillet joints used for forming electrical connections to the conductors.

FIG. 10 illustrates the slider 180 assembled on the suspension 170. The shim 200 is positioned between the slider 180 and the slider portion 174.

In the preferred embodiment, the slider 180 has dimensions of 1 mm×1.25 mm×0.3 mm. However, the present invention is not limited to this slider size. The transducer 192 is electrically connected to the electrical lines 184 by a plurality of electrical connectors 208. The connectors 208 are referred to as right angle fillet joints and are formed in the manner described by Ainslie et al. in U.S. Pat. No. 4,761,699.

In the preferred embodiment, the slider 180 is a conventional magnetoresistive (MR) slider having an air bearing surface 212, a leading edge 216 and a trailing edge 220. A plurality of rains 224 are positioned on the air bearing surface 212 and the transducer 192 is a conventional thin film read/write transducer formed on the trailing edge 220 and used for reading and/or writing data on a hard magnetic disk. However, the present invention is not limited to thin film transducers or to hard magnetic disk technology. The present invention is a suspension system that could be used with other types of data transducers and systems such as optical detectors in optical disk systems or in flexible magnetic media systems.

Figure 11:
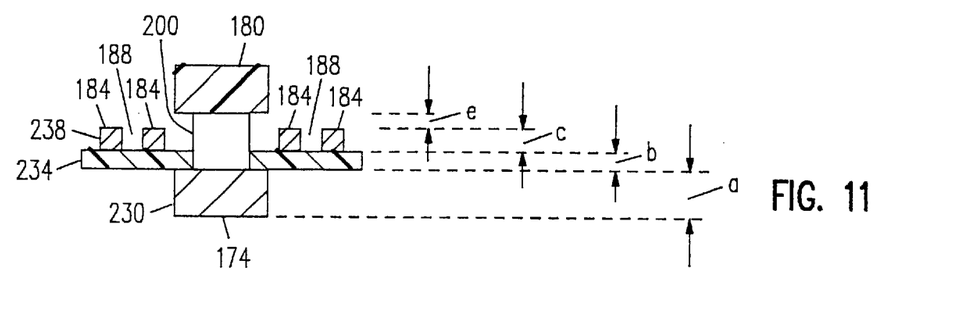
FIG. 11 is a cross-sectional view of the slider suspension system taken along the line 11—11 of FIG. 10.

FIG. 11 is a cross-sectional view illustrating that the slider 180 is seated on the shim 200. The shim 200 serves two purposes: First, the shim 200 provides a means for mechanically attaching the slider 180 to the slider portion 174. In the preferred embodiment, the slider 180 is attached to the shim 200 with epoxy. The shim 200 is attached to the slider portion 174, also with either epoxy or spot welds. Second, the height of the shim 200 provides a clearance between the electrical lines 184 and the slider 180 (see dimension "e" in FIG. 11). The clearance is needed because the electrical lines 184 undergo deflection or deformation caused by forces such as the load of forcing the slider 180 toward the disk 88, or due to vibrations that occur while the slider 180 flies over the disk 88. Typically, "e" is approximately equal to 0.075 mm.

FIG. 11 also illustrates that the suspension 170 is comprised of a three-layer laminate analogous to the laminated structure shown in FIG. 2. The suspension 170 is comprised of a first layer 230 analogous to the first layer 40, a second layer 234 analogous to the second layer 44 and a third layer 238 analogous to the third layer 48. The first layer 230 has a thickness "a"; the second layer 234 has a thickness "b"; and the third layer 238 has a thickness "c". The thicknesses "a", "b" and "c", and the compositions and orientations of the layers 230, 234 and 238 are identical to those previously described for the layers 40, 44 and 48 with respect to FIG. 2.

FIG. 11 also illustrates that the electrical lines 184 are regions of the third layer 238 that are roughly rectangular in cross section, and that have one of the spaces 188 positioned on each side. The spaces 188 extend down to the second layer 234 so that the second layer 234 is exposed through the space 188. One of the spaces 188 is positioned between each adjacent electrical line 184 so as to prevent the electrical line 184 from shorting to the adjacent electrical line 184. The electrical lines 184 are formed in the same manner as was previously described for the electrical lines 66.

Figure 12:
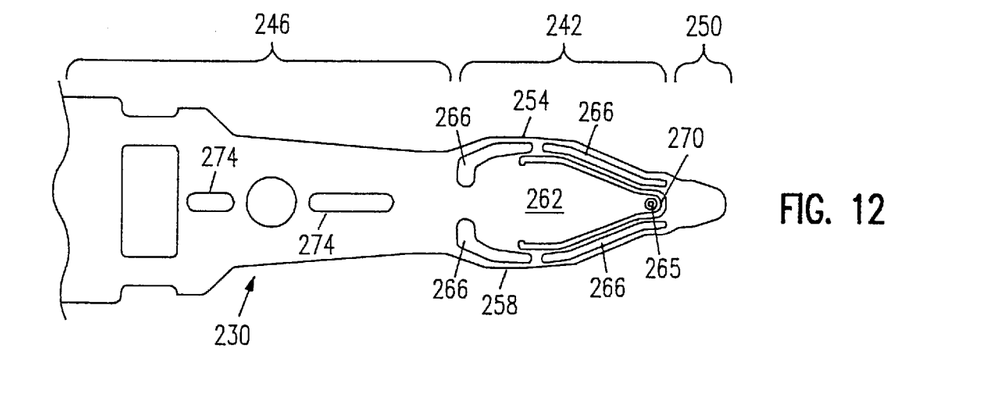
FIG. 12 is a top view of the support layer of the slider suspension system shown in FIG. 9.

FIG. 12 illustrates the shape of the first layer 230 when the second and third layers 234 and 238 are removed from the suspension 170. A flexure portion 242 connects a link portion 246 to a slider portion 250. The link portion 246 forms one layer of the link portion 176 shown in FIG. 9, and the slider portion 250 forms one layer of the slider portion 174 shown in FIG. 9.

The flexure portion 242 is a region of reduced stiffness compared to the link portion 246. The reduced stiffness of the flexure portion 242 allows the slider 180 to conform to, and fly over, a magnetic medium such as the recording disk 88 shown in FIG. 5.

The flexure portion 242 comprises a first flexible finger 254, a second flexible finger 258, and a midsection 262. The flexible finger 254 extends along one outside edge of the flexure portion 242 and the flexible finger 258 extends along the other outside edge of the flexure portion 242. The midsection 262 is positioned between the flexible fingers 254 and 258. Midsection 262 contains a dimple 265 which applies the loading force of the link portion 176 through the shim 200 and onto the slider 180. The dimple 265 is a raised area formed in the first layer 230.

A plurality of slots 266 are formed in the flexible fingers 254 and 258. The slots 266 extend completely through the first layer 230 and have various elongated shapes. The specific shapes. of the slots 266 are not critical but are chosen with the three objectives listed below in mind.

First, the slots 266 reduce the amount of metal contained in the flexible fingers 254 and 258, thereby reducing the stiffness of the flexible fingers 254 and 258. Additionally, the pattern of the slots 266 in the flexible finger 254 are usually the mirror image of the pattern of slots 266 in the flexible finger 258 so as to maintain the symmetry of the suspension 170.

Second, the slots 266 provide regions into which the second and third layers 234 and 238 can deflect when the flexible fingers 254 and 258 bend, thereby further reducing the stiffness of the flexible fingers 254 and 258.

Third, the slots 266 reduce the capacitance of the electrical lines 184 to ground by providing regions over which the electrical lines 184 can run without encountering metal from the layer 230.

A V-shaped slot 270 iE; formed in the first layer 230 to ensure that the flexible fingers 254 and 258 are the parts of the flexure portion 242 that form the mechanical connection to the slider portion 250.

A plurality of slots 274 are formed in the link portion 246. The slots 274 extend completely through the first layer 230 and have various shapes such as circles, ovals and rectangles. The specific shapes of the slots 274 are not critical but are chosen for the purpose of providing regions over which the electrical lines 184 can run without encountering metal from the layer 230. This reduces the capacitance of the electrical lines 184 to ground.

Figure 13:
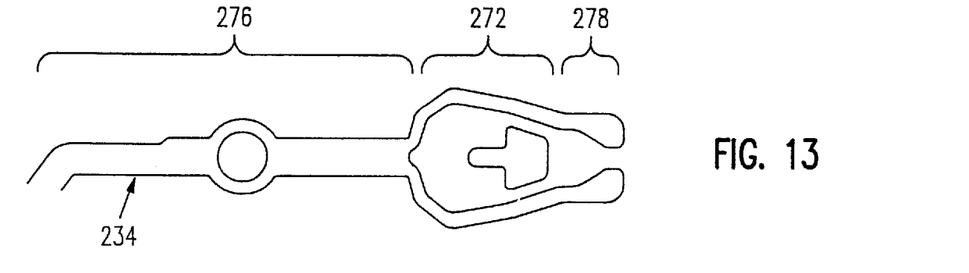
FIG. 13 is a top view of the dielectric layer of the slider suspension system shown in FIG. 9.

FIG. 13 illustrates the shape of the second layer 234 when the first and third layers 230 and 238 are removed from the suspension 170. The second layer 234 includes a flexure portion 272 which lays over the flexible fingers 254 and 258 of the flexure portion 242; an elongated link section 276 which lays over the link section 246; and a slider portion 278 which lays over the slider portion 250.

Figure 14:
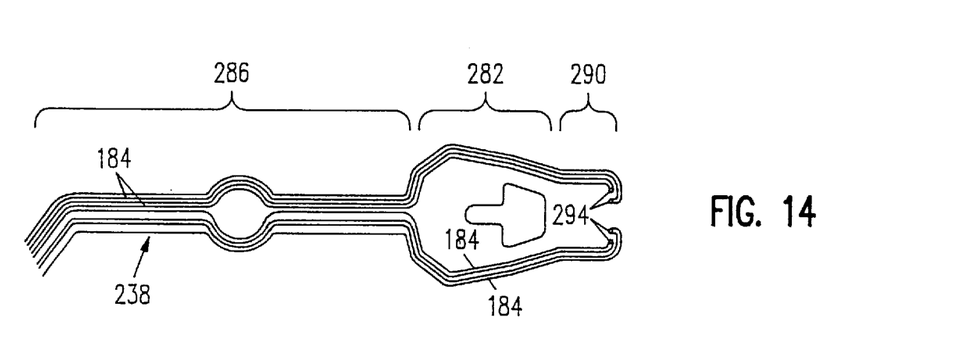
FIG. 14 is a top view of the conductor layer of the slider suspension system shown in FIG. 9.

FIG. 14 illustrates the shape of the third layer 238 when the first and second layers 230 and 234 are removed from the suspension 170. The electrical lines 184 are positioned so that they lay on top of the second layer 234. The third layer 238 includes a flexure portion 282 which lays over the flexure portion 272; an elongated link section 286 which lays over the link section 276; and a slider portion 290 which lays over the slider portion 278. A plurality of pads 294 are areas of the third layer 238 upon which the solder balls 196 are positioned.

The use of a high strength alloy for the third layer 238 allows the thickness of the third layer 238 to be kept thin enough so as not to appreciably contribute to the rigidity of the flexure portion 282 while still providing sufficient robustness to withstand this manufacturing process.

If an extremely flexible flexure portion is required, the first layer 230 can be eliminated entirely from the flexible fingers 254 and 258 leaving only the second layer 234 and the third layer 238 to function as the flexible fingers 254 and 258 (see FIGS. 6 and 8). The third layer 238 can comprise any of the high strength materials described previously for the third layer 48 with respect to FIG. 2.

It should be noted that the present invention is not limited to situations where the electrical conductors 184 are formed in the third layer 238. The suspension 170 could also be constructed using discrete wires positioned over the flexible fingers 254 and 258 for the electrical conductors 184. In this case, the second layer 234 and third layer 238 could be deleted.

Figure 15:
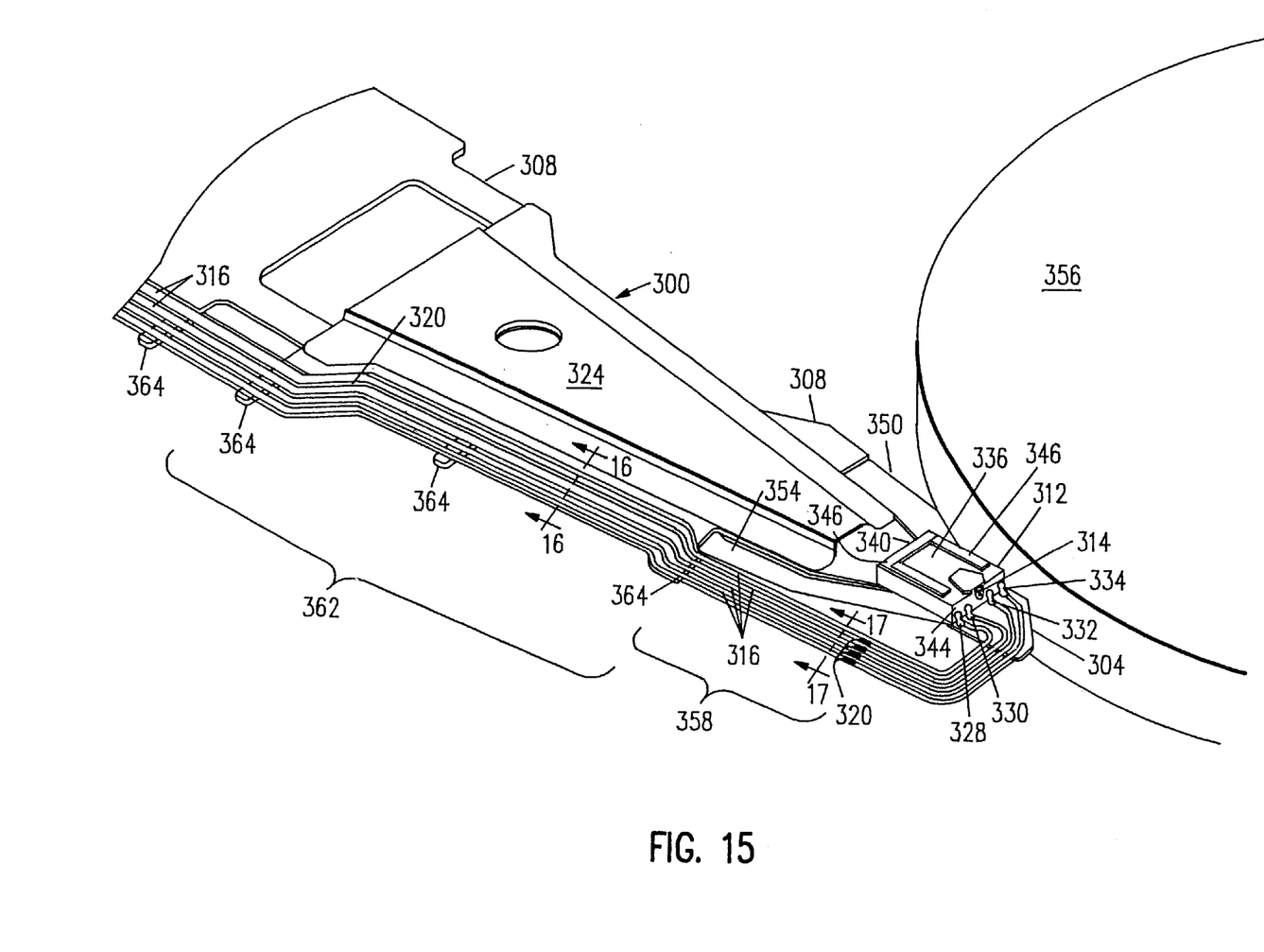
FIG. 15 is an isometric view of a slider suspension system having electrical conductors positioned away from the flexure and down the side of the load beam according to the present invention.

FIG. 15 illustrates a design for a transducer suspension 300 in which the electrical conductors make little or no contribution to the stiffness of the flexure. The construction and use of the suspension 300 is analogous to the construction and use of the suspensions 10 and 170, and the transducer suspension 300 can be substituted for the suspensions 10 or 14 in the disk file 84 shown in FIG. 5.

Specifically, the suspension 300 has a slider portion 304 analogous to the slider portion 54, a link portion 308 (also referred to as a load beam) analogous to the link portion 62 and an arm portion (not shown) analogous to the arm portion 58. The suspension 300 also includes a slider 312 analogous to the slider 22, a plurality of electrical lines 316 analogous to the electrical lines 66 and a plurality of spaces 320 analogous to the spaces 74. The slider 312 also includes one or more data transducers 314 for reading and/or writing data on a magnetic medium.

The suspension 300 also includes a stiffener 324. The stiffener 324 is an optional element that functions to increase the rigidity of the link portion 308 in bending and torsion. If increased rigidity of the link portion 308 is not required, or if it is achieved by additional forming of the link portion 308, then the stiffener 324 may be deleted from the suspension 300.

In the preferred embodiment, the slider 312 has dimensions of 1 mm×1.25 mm×0.3 mm. However, the present invention is not limited to this slider size. The transducer 314 is electrically connected to the electrical lines 316 by a plurality of electrical connectors, designated as electrical connector 328, electrical connector 330, electrical connector 332 and electrical connector 334. The electrical connectors 328, 330, 332 and 334 are referred to as right angle fillet joints and are formed in the manner described by Ainslie et al. in U.S. Pat. No. 4,761,699.

In the preferred embodiment, the slider 312 is a conventional magnetoresistive (MR) slider having an air bearing surface 336, a leading edge 340 and a trailing edge 344. A plurality of rains 346 are positioned on the air bearing surface 336 and the transducer 314 is a conventional thin film read/write transducer formed on the trailing edge 344 and used for reading and/or writing data on a hard magnetic disk. However, the present invention is not limited to thin film transducers or to hard magnetic disk technology. The present invention is a suspension system that could be used with other types of data transducers and systems such as optical detectors in optical disk systems or in flexible magnetic media systems.

FIG. 15 also illustrates that the slider portion 304 is connected to the link portion 308 by a first flexure arm 350 and a second flexure arm 354. The first flexure arm 350 is positioned on the side of the suspension 300 which is closest to a spacer ring 356. The spacer ring 356 is that portion of the spindle shaft 92 that separates the recording disks 88 from each other in FIG. 5.

The slider 312 is positioned on the slider portion 304. The plurality of electrical connectors 328, 330, 332 and 334 (also referred to as termination pads) are positioned on the trailing edge 344. In the preferred embodiment, the connectors 328 and 330 are configured as write-write termination pads and the connectors 332 and 334 are configured as read-read termination pads. This enables the write lines to act as electromagnetic shields to the read lines during the read operation.

The electrical lines 316 are routed from the electrical connectors 328, 330, 332 and 334 along the side of the suspension 300 that is facing away from the spacer ring 356. In a region 358, the electrical lines 316 do not have any part of the first layer 370 underneath them, and are said to be freely suspended. The region 358 is adjacent to the flexure arm 354 but is outside of the flexure arm 354, meaning that the region 358 is further away from the spacer ring 356 than the flexure arm 354.

In a region 362, the electrical lines 316 extend along an edge of the suspension 300 where a plurality of support tabs 364 and/or the suspension 300 are positioned underneath the electrical lines 316 for support. In the embodiment shown in FIG. 15, the two read lines (i.e. the electrical lines 316 which are connected to the connectors 332 and 334) are positioned along the outermost perimeter of the suspension 300 and are supported only by the support tabs 364. In contrast, the two write lines (i.e. the electrical lines 316 which are connected to the connectors 328 and 330) are supported by some of the support tabs 364 and by sections of the first layer 370. This feature reduces the capacitance of the read lines to ground.

In the preferred embodiment, the electrical lines 316 are continuous from the electrical connectors 328, 330, 332 and 334 at least through the end of the region 362. However, the electrical lines 316 could be broken and electrically reconnected at any point. For example, the region 358 could comprise a first plurality of electrical lines and the region 362 could comprise a second plurality of electrical lines connected to the first plurality of electrical lines.

Figure 16:
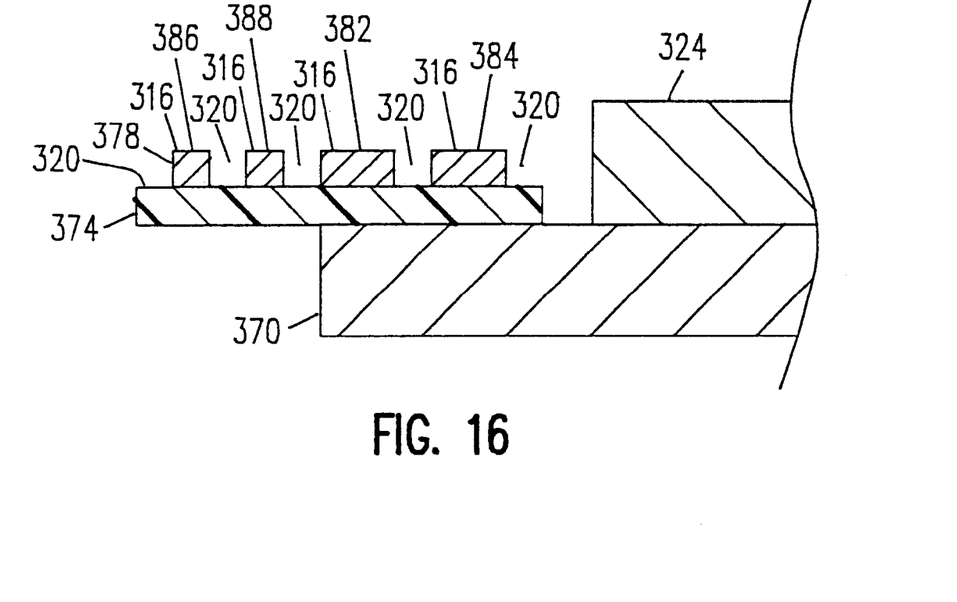
FIG. 16 is a cross-sectional view of the slider suspension system taken along the line 16—16 of FIG. 15.

FIG. 16 illustrates that in the region 362, the suspension 300 is comprised of a three-layer laminate analogous to the laminates structure shown in FIG. 2. The suspension 300 is comprises of a first layer 370 analogous to the first layer 40, a second layer 374 analogous to the second layer 44 and a third layer 378 analogous to the third layer 48. The thicknesses and compositions of the layers 370, 374 and 378 are identical to those previously described for the layers 40, 44 and 18 with respect to FIG. 2.

FIG. 16 illustrates that the electrical lines 316 are regions of the third layer 378 that are roughly rectangular in cross section, and that have one of the spaces 320 positioned on each side. The spaces 320 extend down to the second layer 374 so that the second layer 374 is exposed through the space 320. One of the spaces 320 is positioned between each adjacent electrical line 316 so as to prevent the electrical line 316 from shorting out the adjacent electrical line 316. The electrical lines 316 are formed in the same manner as was previously described for the electrical lines 66.

FIG. 16 also illustrates the portion of the region 362 where the two write electrical lines 316 are supported by a section of the suspension 300, namely the first layer 370. The two write electrical lines 316 are labeled 382 and 384 in FIG. 16 and are shown having a width which is approximately twice the width of the two read electrical lines 316 which are labeled 386 and 388. Along most of the length of the region 362, the two read electrical lines 386 and 388 are not supported by the first layer 370, as is illustrated in FIG. 16.

Figure 17:
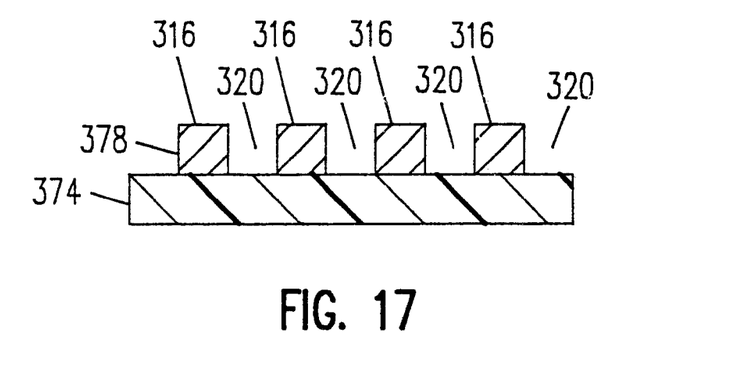
FIG. 17 is a cross-sectional view of the slider suspension system taken along the line 17—17 of FIG. 15.

FIG. 17 is a cross-sectional view illustrating that in the region 358, the electrical lines 316 are not supported by the first layer 370. In this region 358, the electrical lines 316 all have the same width and are equally spaced apart, and only the second layer 374 is positioned underneath the electrical lines 316.

Figure 18:
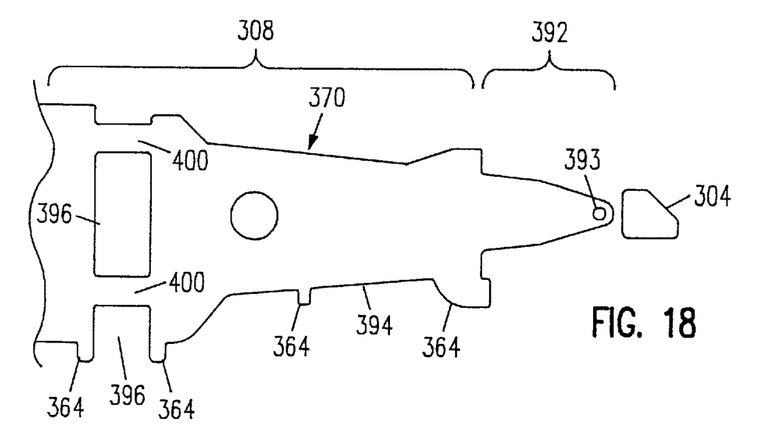
FIG. 18 is a top view of the support layer of the slider suspension system shown in FIG. 15.

FIG. 18 illustrates the shape of the first layer 370 when the second and third layers 374 and 378 are removed from the suspension 300. A flexure portion 392 is positioned between the link portion 308 to the slider portion 304. However, the slider portion 304 is not connected to the flexure portion 392. A raised dimple 393, analogous to the dimple 265, is positioned on the flexure portion 392.

The first layer 370 includes the plurality of tabs 364 which are positioned along a side 394. The tabs 364 provide support for the read electrical lines 316. A plurality of slots 396 are formed in the link portion 370. The slots 396 extend completely through the first layer 370. The function of the slots 396 is to allow the stiffness of the link portion 308 to be controlled mainly by a pair of load adjust areas 400. The load adjust areas 400 are the predominant features for controlling the preload of the suspension 300.

Figure 19:
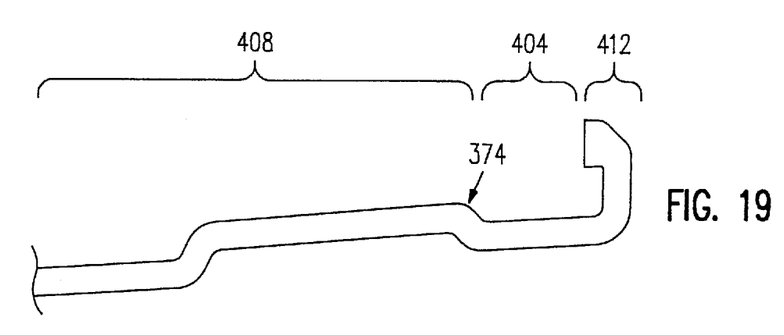
FIG. 19 is a top view of the dielectric layer of the slider suspension system shown in FIG. 15.

FIG. 19 illustrates the shape of the second layer 374 when the first and third layers 370 and 378 are removed from the suspension 300. The second layer 374 includes a flexure portion 404 which runs adjacent to the flexure arm 354 but which is positioned farther away from the spacer ring 356 than the flexure arm 354 and which does not overlap the flexure arm 354. An elongated link section 408 runs adjacent to the side 394 of the first layer 370 and is positioned over the tabs 364 and part of the link section 308. A slider portion 412 makes an approximately ninety degree angle to the flexure portion 404 and lays over the slider portion 304 of the first layer 370. In the preferred embodiment, the second layer 374 comprises a continuous layer of material and the portions 404, 408 and 412 merely refer to sections of the continuous layer.

Figure 20:
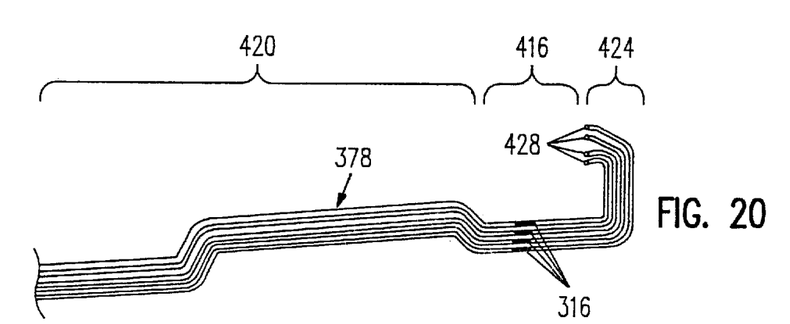
FIG. 20 is a top view of the conductor layer of the slider suspension system shown in FIG. 15.

FIG. 20 illustrates the shape of the third layer 378 when the first and second layers 370 and 374 are removed from the suspension 300. The electrical lines 316 are positioned so that they lay on top of the second layer 374. The third layer 378 includes a flexure portion 416 which lays over the flexure portion 404; an elongated link section 420 which lays over the link section 408; and a slider portion 424 which lays over the slider portion 412. A plurality of pads 428 are areas of the third layer 378 upon which the electrical connectors 328, 330, 332 and 334 are positioned.

In the preferred embodiment, the third layer 378 comprises a continuous layer of material and the portions 416, 420 and 424 merely refer to sections of the continuous layer. The flexure portion corresponds to the region 358 of FIG. 15 and the link portion 420 corresponds to the region 362 of FIG. 15.

Figure 21:
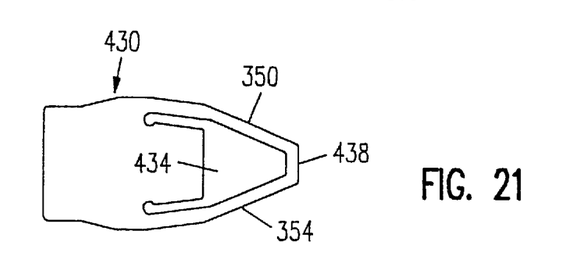
FIG. 21 is a top view of the flexure member of the slider suspension system shown in FIG. 15.

FIG. 21 illustrates that the flexure arms 350 and 354 are parts of a flexure member 430, which is a separate piece from the layers 370, 374 and 378. The flexure member 430 is comprised of stainless steel (e.g. 302 stainless steel), similar to the first layer 370, but the flexure member 430 is thinner and more compliant than the first layer 370. A cavity 434 is positioned between the flexure arms 350 and 354 and extends completely through the flexure member 430. A crossbar 438 connects the flexure arms 350 and 354.

When the suspension 300 is assembled, the flexure member 430 is attached to the first layer 370 by either epoxy or spot welds on the side of the first layer 370 which is opposite to the side of the first layer 370 on which the layer 374 sits. During assembly, the flexure member 430 is positioned under the flexure portion 392 with the crossbar 438 positioned underneath of, and attached to, the slider portion 304. The cavity 434 is underneath the flexure portion 392. Therefore, the slider 312 sits on the slider portion 304 and on the dimple 393.

If used, the stiffener 324 (shown in FIG. 15) is attached to the first layer 370 by spot welds or epoxy and acts as a stiffener to increase the rigidity of the suspension 300.

The flexure arms 3510 and 354 are regions of reduced stiffness compared to the link portion 308. The reduced stiffness of the flexure arms 350 and 354 allows the slider 312 to conform to, and fly over, a magnetic medium such as the recording disk 88 shown in FIG. 5.

Referring to FIGS. 15–21, the functioning of the suspension 300 can be explained. The suspension 300 provides a head gimbal assembly design in which four objectives are realized: First, the stiffness of the electrical lines 316 does not appreciably affect the stiffness of the flexure arms 350 and 354. As is shown in FIG. 15, the electrical lines 316 are routed off to one side in the region 358. Since the electrical lines 316 do not overlap the flexure arms 350 or 354, they do not contribute appreciably to the stiffness of the flexure arms 350 or 354. Additionally, FIG. 17 illustrates that the first layer 370 has been removed from underneath the electrical lines 316 in the region 358. This means that the flexure arms 350 and 354 are the predominant mechanical members for providing stiffness to the slider 312. The use of a high strength alloy for the third layer 378, such as the Cu—Ni—Si—Mg alloy, the Be—Cu—Ni alloy, the Cu—Fe—Zn—P alloy or the Cu—Ti alloy described previously, allows the thickness of the third layer 378 to be kept thin enough so as not to appreciably contribute to the rigidity of the flexure arms 350 and 354, while still providing sufficient strength to support the electrical lines 316, and to survive the manufacturing process.

It should be noted that the present invention is not limited to situations where the electrical lines 316 are formed in the third layer 378. The suspension 300 could also be constructed using discrete wires positioned in the regions 358 and 362 to function as the electrical lines 316. In this case, the second layer 374 third layer 378 could be deleted.

The second advantage of the design of the suspension 300 is that the removal of the first layer 370 from underneath the two read electrical lines 316 over most of their length, reduces the capacitance of the read lines and improves the data handling capabilities of the suspension 300. FIGS. 15 and 16 illustrate that the first layer 370 has been removed from underneath the two read electrical lines 316 (i.e. the two outermost lines 316) except in the area of the support tabs 364.

In some embodiments, it may be desirable to reorder the electrical lines 316 in a write-read-write-read configuration. In such a case, one or more slots like the slots 266 of FIG. 12 can be used to reduce the capacitance of the read lines.

The third advantage of the design of the suspension 300 is that the conventional termination pad ordering of write-read-read-write, can be achieved with the present design by simply configuring the connector 328 as a write pad, the connectors 330 and 332 as read pads and the connector 334 as a write pad. The routing of the electrical lines 316 allows this without increasing the susceptibility for picking up electromagnetic (EM) noise. The electrical lines 316 connecting to the read pads 330 and 332 need to be kept close together and a constant distance apart so as not to create a loop of conductor material that would act as an antenna for EM noise. In contrast, with reference to FIG. 9, it can be seen that the electrical lines 184 must be kept in a read-read, write-write ordering so as to avoid the situation of creating a conductor loop that would be susceptible to EM noise.

The fourth advantage of the design of the suspension 300 is that by routing the electrical lines 316 along the outer side of the suspension 300, the suspension 300 can get closer to the spacer ring 356. This allows more data tracks to be accessed by the slider 312 than is possible with other suspension designs.

Although the present invention has been described in terms of the presently preferred embodiment, it is to be understood that such disclosure is not to be interpreted as limiting. Various alterations and modifications will no doubt become apparent to those skilled in the art after having read the above disclosure. Accordingly, it is intended that the appended claims be interpreted as covering all alterations and modifications as fall within the true spirit and scope of the invention.

What is claimed is:

1. A suspension system for supporting a magnetic read/write slider comprising:
    a load beam for mechanically supporting a slider;
    a slider support member for providing a region on which the slider can be mechanically attached;
    a flexure having less stiffness than the load beam and connecting the load beam to the slider support member, the flexure comprising a first flexible finger region extending along a first outside edge of the flexure and a second flexible finger region extending along a second outside edge of the flexure, the first flexible finger region and the second flexible finger region each comprising a multilayered material comprised of a first layer, a second layer positioned over the first layer, and a third layer positioned over the second layer, the first layer comprising a metal, the second layer comprising a dielectric material and the third layer comprising an electrically conductive material with the first flexible finger region being connected to the slider support member by at least a part of the first layer and the second flexible finger region being connected to the slider support member by at least a part of the first layer;
    at least one slot that extends completely through the first layer of the first flexible finger region; and
    at least one electrical conductor formed in the third layer of the first flexible finger region and positioned over the slot.

2. The suspension system of claim 1 further comprising:
    a plurality of electrical conductors extending along the second flexible finger region.

3. The suspension system of claim 1 wherein the third layer has a thickness less than or equal to eighteen microns.

4. The suspension system of claim 1 wherein the third layer comprises an electrically conductive material selected from the group consisting of Cu—Ni—Si—Mg alloy, Be—Cu—Ni alloy and Cu—Ti alloy.

5. The suspension system of claim 1 wherein the first layer comprises stainless steel.

6. The suspension system of claim 1 wherein the second layer comprises a polyimide.

7. The suspension system of claim 1 further comprising:
    at least one slot that extends completely through the first layer of the second flexible finger region; and at least one electrical conductor formed in the third layer of the second flexible finger region and positioned over the slot that extends completely through the first layer of the second flexible finger region.

8. A suspension system comprising:
a magnetic read/write transducer for reading and/or writing data on a magnetic storage medium;
a slider for holding the transducer;
a slider support member for providing a region on which the slider is mechanically attached;
a load beam for mechanically supporting the slider;
a flexure having less stiffness than the load beam and connecting the load beam to the slider support member, the flexure comprising a first flexible finger region extending along a first outside edge of the flexure and a second flexible finger region extending along a second outside edge of the flexure, the first flexible finger region and the second flexible finger region each comprising a multilayered material comprised of a first layer, a second layer positioned over the first layer, and a third layer positioned over the second layer, the first layer comprising a metal, the second layer comprising a dielectric material and the third layer comprising an electrically conductive material selected from the group consisting of Cu—Ni—Si—Mg alloy, Be—Cu—Ni alloy and Cu—Ti alloy;
at least one slot that extends completely through the first layer of the first flexible finger region; and
at least one electrical conductor formed in the third layer of the first flexible finger region and positioned over the slot.

9. A disk drive system comprising:
a data storage medium;
a data transducer for reading and/or writing data on the data storage medium;
an actuator for moving the data transducer relative to the data storage medium;
a slider for holding the data transducer;
a slider support member for providing a region on which the slider is mechanically attached;
a load beam for mechanically supporting the slider;
a flexure having less stiffness than the load beam and connecting the load beam to the slider support member, the flexure comprising a first flexible finger region extending along a first outside edge of the flexure and a second flexible finger region extending along a second outside edge of the flexure, the first flexible finger region and the second flexible finger region each comprising a multilayered material comprised of a first layer, a second layer positioned over the first layer, and a third layer positioned over the second layer, the first layer comprising a metal, the second layer comprising a dielectric material and the third layer comprising an electrically conductive material selected from the group consisting of Cu—Ni—Si—Mg alloy, Be—Cu—Ni alloy and Cu—Ti alloy;
at least one slot that extends completely through the first layer of the first flexible finger region; and
at least one electrical conductor formed in the third layer of the first flexible finger region and positioned over the slot.

10. A suspension system for supporting a magnetic read/write slider comprising:
a load beam for mechanically supporting a slider, the load beam comprising a first layer comprised of a metal, a second layer comprised of a dielectric material and positioned over the first layer, and a third layer comprised of an electrically conductive material and positioned over the second layer;
a slider support member for providing a region on which the slider can be mechanically attached;
a flexure for connecting the load beam to the slider support member, the flexure comprising a first flexure arm which forms a first outside edge of the flexure and a second flexure arm which forms a second outside edge of the flexure; and
a plurality of electrical conductors formed in the third layer, the plurality of electrical conductors including a first section and a second section, the first section comprising a region where the plurality of electrical conductors are positioned over the second layer and the first layer of the load beam along an outside edge of the load beam, and the second section comprising a region where the plurality of electrical conductors are positioned over only the second layer, the second section being positioned adjacent to the second flexure arm and outside of the second flexure arm.

11. The suspension system of claim 10 wherein the plurality of electrical conductors have a thickness less than or equal to eighteen microns.

12. The suspension system of claim 10 wherein the plurality of electrical conductors comprises a high strength electrically conductive material selected from the group consisting of Cu—Ni—Si—Mg alloy, Be—Cu—Ni alloy and Cu—Ti alloy.

13. The suspension system of claim 10 wherein the flexure comprises a separate piece that is attached to the load beam.

14. A disk drive system comprising:
a data storage medium;
a data transducer for reading and/or writing data on the data storage medium;
an actuator for moving the data transducer relative to the data storage medium;
a slider for holding the data transducer;
a slider support member for providing a region on which the slider is mechanically attached;
a load beam for mechanically attaching the slider support member to the actuator, the load beam comprising a first layer comprised of a rigid material, a second layer comprised of a dielectric material and positioned over the first layer, and a third layer comprised of an electrically conductive material selected from the group consisting of Cu—Ni—Si—Mg alloy, Be—Cu—Ni alloy and Cu—Ti alloy, the third layer being positioned over the second layer;
a flexure for connecting the load beam to the slider support member, the flexure comprising a first flexure arm which forms a first outside edge of the flexure and a second flexure arm which forms a second outside edge of the flexure, the second flexure arm being positioned farther away from the center of the data storage medium than the first flexure arm; and a plurality of electrical conductors formed in the third layer, the plurality of electrical conductors including a first section and a second section, the first section comprising a region where the plurality of electrical conductors are positioned over the second layer and the first layer of the load beam along an outside edge of the load beam, and the second section comprising a region where the plurality of electrical conductors are positioned over only the second layer, the second section being positioned adjacent to the second flexure arm and outside of the second flexure arm.

15. The disk drive system of claim 14 wherein the plurality of electrical conductors have a thickness less than or equal to eighteen microns.

16. The disk drive system of claim 14 wherein the flexure comprises a separate piece that is attached to the load beam.

* * * * *